United States Patent
Kishimoto et al.

(10) Patent No.: US 8,395,250 B2
(45) Date of Patent: Mar. 12, 2013

(54) PLASMA PROCESSING APPARATUS WITH AN EXHAUST PORT ABOVE THE SUBSTRATE

(75) Inventors: Katsushi Kishimoto, Osaka (JP); Yusuke Fukuoka, Osaka (JP)

(73) Assignee: Kabushiki Kaisha Sharp, Osaka (JP)

( * ) Notice: Subject to any disclaimer, the term of this patent is extended or adjusted under 35 U.S.C. 154(b) by 403 days.

(21) Appl. No.: 12/676,526

(22) PCT Filed: Sep. 2, 2008

(86) PCT No.: PCT/JP2008/065729
§ 371 (c)(1),
(2), (4) Date: Mar. 4, 2010

(87) PCT Pub. No.: WO2009/031520
PCT Pub. Date: Mar. 12, 2009

(65) Prior Publication Data
US 2010/0193915 A1    Aug. 5, 2010

(30) Foreign Application Priority Data
Sep. 4, 2007   (JP) .................................. 2007-228802

(51) Int. Cl.
*H01L 23/20*    (2006.01)
*H01L 21/302*    (2006.01)
*C23C 16/50*    (2006.01)
*H05H 1/24*    (2006.01)

(52) U.S. Cl. .................... 257/682; 438/706; 118/723 R; 427/569

(58) Field of Classification Search .................. None
See application file for complete search history.

(56) References Cited

U.S. PATENT DOCUMENTS

| | | | |
|---|---|---|---|
| 4,264,393 A | 4/1981 | Gorin et al. | |
| 4,289,598 A | 9/1981 | Engle | |
| 5,556,474 A | 9/1996 | Otani et al. | |
| 6,079,358 A | 6/2000 | Kim et al. | |
| 6,187,101 B1 | 2/2001 | Yoshizawa | |
| 2003/0207593 A1* | 11/2003 | Derderian et al. | 438/778 |
| 2004/0113287 A1 | 6/2004 | Kishimoto et al. | |

(Continued)

FOREIGN PATENT DOCUMENTS

| | | |
|---|---|---|
| EP | 1 650 326 A2 | 4/2006 |
| JP | 61-17151 | 1/1986 |

(Continued)

OTHER PUBLICATIONS

Search Report dated Oct. 13, 2010 for corresponding EP application 08829812.0.

(Continued)

*Primary Examiner* — Alonzo Chambliss
(74) *Attorney, Agent, or Firm* — Nixon & Vandrhye, P.C.

(57) ABSTRACT

In a chamber of a plasma processing apparatus, a cathode electrode and an anode electrode are disposed at a distance from each other. The cathode electrode is supplied with electric power from an electric power supply portion. The anode electrode is electrically grounded and a substrate is placed thereon. The anode electrode contains a heater. In an upper wall portion of the chamber, an exhaust port is provided and connected to a vacuum pump through an exhaust pipe. In a lower wall portion of a wall surface of the chamber, a gas introduction port is provided. A gas supply portion is provided outside the chamber.

7 Claims, 7 Drawing Sheets

U.S. PATENT DOCUMENTS

| | | |
|---|---|---|
| 2005/0019576 A1* | 1/2005 | Dahl et al. .................... 428/408 |
| 2005/0103265 A1 | 5/2005 | Gianoulakis et al. |
| 2007/0227666 A1* | 10/2007 | Matsumoto et al. ..... 156/345.47 |
| 2009/0104781 A1* | 4/2009 | Sasaki et al. .................. 438/710 |

FOREIGN PATENT DOCUMENTS

| | | |
|---|---|---|
| JP | 9-223685 | 8/1997 |
| JP | 9-263931 | 10/1997 |
| JP | 9-320966 | 12/1997 |
| JP | 10-12558 | 1/1998 |
| JP | 2001-81559 | 3/2001 |
| JP | 2004-214604 | 7/2004 |
| WO | WO 2005/104186 | 11/2005 |

OTHER PUBLICATIONS

International Search Report for PCT/JP2008/065729, mailed Nov. 18, 2008.

* cited by examiner

PLASMA PROCESSING APPARATUS WITH AN EXHAUST PORT ABOVE THE SUBSTRATE

This application is the U.S. national phase of International Application No. PCT/JP2008/065729 filed 2 Sep. 2008, which designated the U.S. and claims priority to Japan Application No. 2007-228802 filed 4 Sep. 2007, the entire contents of each of which are hereby incorporated by reference.

TECHNICAL FIELD

The present invention relates to a plasma processing apparatus and a plasma processing method as well as a semiconductor device, and particularly to a plasma processing apparatus for subjecting an object to plasma processing by introducing a gas into a hermetically sealable chamber, a plasma processing method, and a semiconductor device manufactured with such a plasma processing apparatus or a plasma processing method.

BACKGROUND ART

A plasma processing apparatus has conventionally been available as an apparatus for forming a thin film or for performing etching process. An exemplary plasma processing apparatus includes a plasma processing apparatus in which a substrate is horizontally arranged between a cathode electrode and an anode electrode disposed within a chamber. In addition, U.S. Pat. No. 4,289,598 (Patent Document 1) discloses a plasma processing apparatus in which a substrate is perpendicularly arranged. In this plasma processing apparatus, an exhaust port of a vacuum pump for evacuating a chamber is provided in a side surface of the chamber.

Moreover, Japanese Patent Laying-Open No. 2001-81559 (Patent Document 2) discloses a plasma processing apparatus in which a substrate is arranged in an inclined manner. In this plasma processing apparatus, an exhaust port of a vacuum pump is provided in a lower portion of a chamber. U.S. Pat. No. 4,264,393 (Patent Document 3) discloses a plasma processing apparatus in which a plurality of cathode electrodes and a plurality of anode electrodes are arranged within a chamber such that they are vertically aligned. In this plasma processing apparatus, an exhaust port of a vacuum pump is provided in a lower portion of the chamber and the chamber is evacuated through that exhaust port to produce vacuum.
Patent Document 1: U.S. Pat. No. 4,289,598
Patent Document 2: Japanese Patent Laying-Open No. 2001-81559
Patent Document 3: U.S. Pat. No. 4,264,393

DISCLOSURE OF THE INVENTION

Problems to be Solved by the Invention

The conventional plasma processing apparatuses, however, have suffered the following problems. Initially, the plasma processing apparatuses described in Patent Document 1 and Patent Document 2 do not particularly give rise to a problem in plasma processing for a short period of time. As the plasma processing continues, however, a temperature of a substrate located in an upper portion of a chamber increases because of energy of plasma, relative to a temperature of the substrate located in a lower portion of the chamber. Accordingly, such a problem as temperature variation within a substrate surface arises.

Namely, a gas introduced in the chamber is decomposed by plasma, a temperature of the gas is raised by the energy of plasma during plasma processing, and the gas moves upward to the upper portion of the chamber. The decomposed gas that has moved up to the upper portion of the chamber stagnates in the upper portion of the chamber. On the other hand, the gas of which temperature has lowered moves downward from the upper portion to the lower portion of the chamber, and this gas changes places with the gas of which temperature has been raised by the energy of plasma. This cycle causes the gas at a low temperature located in the lower portion of the chamber to be exhausted through an exhaust port. Therefore, the gas at a high temperature stagnates in the upper portion of the chamber and the substrate located in the upper portion of the chamber becomes higher in temperature than the substrate located in the lower portion.

Difference in temperature among the substrates to be subjected to plasma processing causes difference in quality or in an etching rate of a film formed during plasma processing, which results in variation in quality or variation in an etched amount within the substrate surface. In such a vacuum process, conventionally, a temperature of the substrates before introduction of the gas has been measured and absence of temperature variation in the substrate has been confirmed. On the other hand, temperature change of the substrate during plasma processing while introducing a gas has hardly been taken into consideration.

The inventors of the subject application have found that a temperature of the substrate changes and temperature variation is caused also during plasma processing, and finally completed the present invention. Temperature variation in the substrate is particularly noticeable in a plasma processing apparatus having a great chamber capacity for processing a large-sized substrate or in a plasma processing apparatus including a large number of members preventing gas flow within the chamber.

For similar reasons, the plasma processing apparatus described in Patent Document 3 has also suffered the problem of temperature variation in the substrate. Namely, in this plasma processing apparatus, as a plurality of cathode electrodes and a plurality of anode electrodes are disposed in a vertical direction within the chamber, the substrate arranged between the cathode electrode and the anode electrode located in the upper portion of the chamber was higher in temperature than the substrate arranged in the lower portion of the chamber.

The present invention was made to solve the above-described problems, and an object of the present invention is to provide a plasma processing apparatus overcoming non-uniformity of a temperature in a substrate surface or non-uniformity of temperatures among substrates by lessening temperature variation within a chamber during plasma processing. Another object is to provide such a plasma processing method, and yet another object is to provide a semiconductor device manufactured with such a plasma processing apparatus or a plasma processing method.

Means for Solving the Problems

A plasma processing apparatus according to the present invention includes a chamber and an exhaust port. An object to be subjected to plasma processing is loaded in the chamber, and the loaded object is subjected to prescribed plasma processing. The exhaust port is attached at such a prescribed position in the chamber that flow of a gas in a space in an upper portion within the chamber does not stagnate, for exhausting the gas within the chamber.

According to this structure, as the exhaust port is attached at such a prescribed position that flow of the gas in the space in the upper portion within the chamber does not stagnate, stagnation of the gas at a high temperature in the upper portion within the chamber is suppressed and variation in the gas temperature in a vertical direction within the chamber is lessened. Consequently, uniformity of the temperature of the object can be improved and uniform plasma processing of the object can be achieved.

Specifically, preferably, the plasma processing apparatus includes a holding portion disposed within the chamber, for holding the object in prescribed arrangement, and the exhaust port is disposed at a position higher than a highest portion of the object held by the holding portion.

More specifically, the exhaust port is preferably attached to an upper wall portion of the chamber, and further specifically, the exhaust port is preferably attached to a prescribed portion of the upper wall portion located directly above the object while the holding portion holds the object.

In addition, preferably, the holding portion includes a vertically holding portion for holding a substrate representing the object in such a manner that the substrate vertically stands.

In this case, even when the substrate vertically stands, plasma processing uniform within the substrate surface can be achieved.

In addition, the holding portion may include a horizontally holding portion for holding a substrate representing the object in a horizontal direction, and the holding portion may include a stack holding portion for holding a plurality of horizontally held substrates as stacked in a vertical direction.

In this case, even when the substrate is horizontally laid, plasma processing uniform within the substrate surface can be achieved.

In addition, preferably, the plasma processing apparatus further includes another exhaust port for exhausting the gas within the chamber, and another exhaust port is disposed at a position lower than a lowest portion of the object held by the holding portion.

In this case, as another exhaust port in addition to the exhaust port is provided in the chamber and the gas at a low temperature located in the lower portion within the chamber is exhausted, an amount of the gas of which temperature is raised by the energy of plasma and which moves upward to the upper portion within the chamber can be reduced. Thus, temperature increase of the gas around the substrate located in the upper portion within the chamber can further be suppressed and uniformity of plasma processing of the substrate can further be improved.

More specifically, another exhaust port is preferably attached to a lower wall portion of the chamber, and further specifically, another exhaust port is preferably attached to a prescribed portion of the lower wall portion located directly under the object while the holding portion holds the object.

A plasma processing method according to the present invention is a plasma processing method for subjecting an object loaded in a prescribed chamber to plasma processing, and the plasma processing method includes the following steps. A prescribed gas for plasma processing is introduced into the chamber. Plasma is generated within the chamber. The object loaded in the chamber is subjected to plasma processing by being exposed to plasma. The chamber is evacuated from a prescribed position above a highest portion of the object such that flow of the gas in a space in an upper portion within the chamber does not stagnate.

According to this method, as the chamber is evacuated from the prescribed position above the highest portion of the object, stagnation of the gas at a high temperature in the upper portion within the chamber is suppressed and variation in the gas temperature in the vertical direction within the chamber is lessened. Thus, uniformity of the temperature of the object can be improved and uniform plasma processing of the object can be achieved.

A semiconductor device according to the present invention is a semiconductor device manufactured with the plasma processing apparatus or the plasma processing method described above.

According to this semiconductor device, as the surface of the substrate is uniformly subjected to plasma processing, quality of a semiconductor film can be uniform within a substrate surface and variation of device characteristics within the substrate surface can be suppressed.

DESCRIPTION OF THE REFERENCE SIGNS 1 chamber; 2 cathode electrode; 2a discharge surface; 3 anode electrode (holding portion); 3a discharge surface; 4 electric power supply portion; 7, 7a to 7e substrate (object); 8 gas supply portion; 10 gas introduction port; 19a exhaust port; 19b another exhaust port; 20 exhaust portion; and 21 heater.

BEST MODES FOR CARRYING OUT THE INVENTION

First Embodiment

Figure 1:
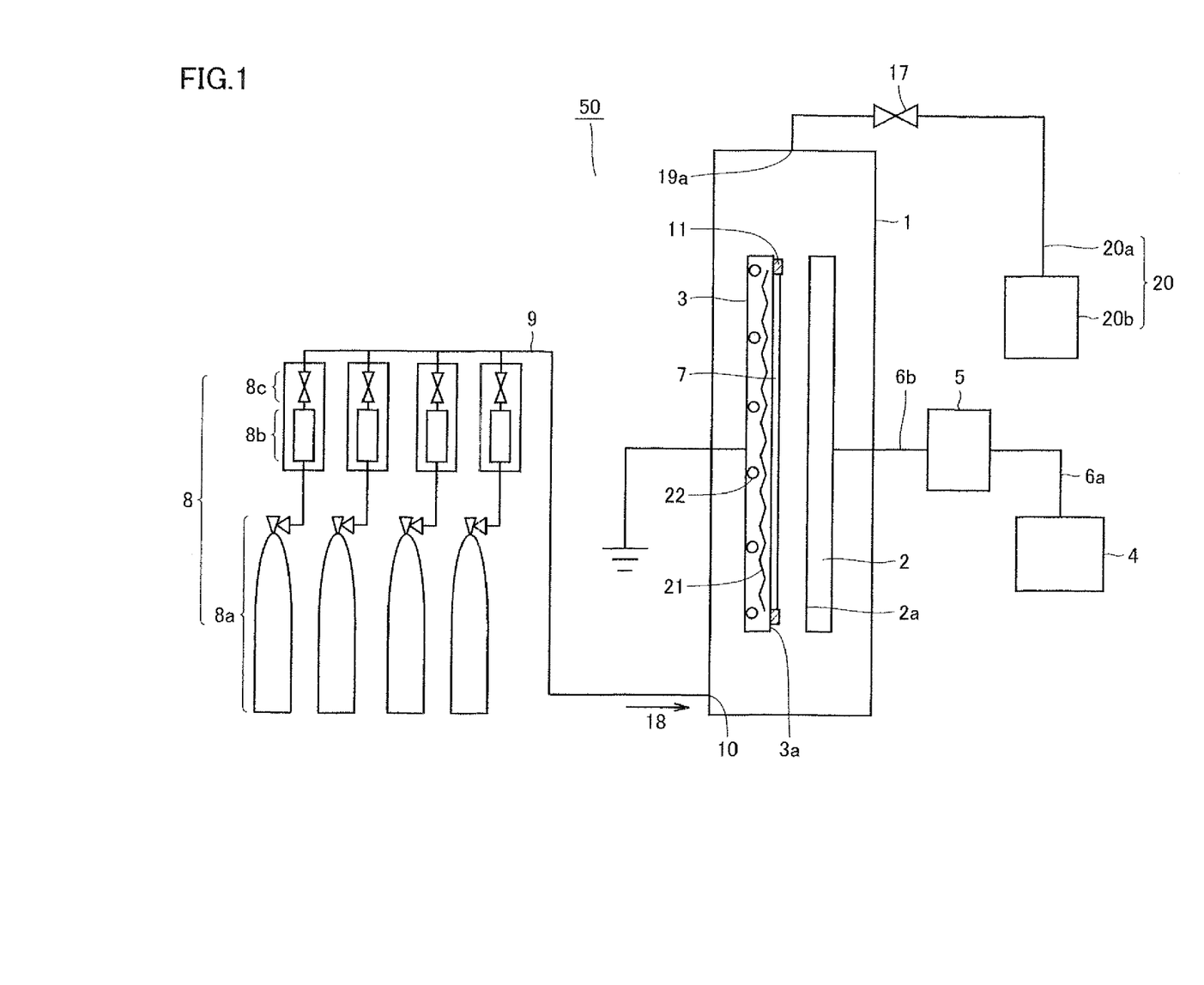
FIG. 1 is a diagram including a partial cross-section showing a structure of a plasma CVD apparatus according to a first embodiment of the present invention.

Here, a plasma CVD (Chemical Vapor Deposition) apparatus for forming a prescribed film on a substrate while the substrate is arranged substantially vertically (perpendicularly) within a chamber will be described by way of example of a plasma processing apparatus. This plasma CVD apparatus is a plasma CVD apparatus including a parallel plate type electrode structure. As shown in FIG. 1, a cathode electrode 2 and an anode electrode 3 opposed to each other are disposed at a distance from each other within a chamber 1 of a plasma processing apparatus 50. Cathode electrode 2 and anode electrode 3 are not limited to the parallel plate type, so long as an electrode structure having opposing discharge surfaces 2a and 3a at a distance from each other is employed.

Though an electrode structure in which one electrode pair (pair) of cathode electrode 2 and anode electrode 3 is provided is illustrated by way of example in this plasma processing apparatus 50, the electrode structure may be provided with a plurality of such pairs. A distance between cathode electrode 2 and anode electrode 3 (distance between the electrodes) is determined in accordance with a desired plasma processing condition and it is generally set to several mm to several ten mm.

An electric power supply portion 4 for supplying electric power to cathode electrode 2 is provided outside chamber 1. An impedance matching circuit 5 is provided between electric power supply portion 4 and cathode electrode 2. Impedance matching circuit 5 carries out impedance matching between electric power supply portion 4 and the pair of cathode electrode 2 and anode electrode 3. Electric power supply portion 4 is connected to one end of an electric power introduction line 6a. The other end of electric power introduction line 6a is connected to impedance matching circuit 5.

One end of an electric power introduction line 6b is connected to impedance matching circuit 5 and the other end of electric power introduction line 6b is connected to cathode electrode 2. Electric power supply portion 4 should only be able to output AC power, and high-frequency power at 13.56 MHz is normally used. The frequency of the AC power is not limited thereto, and a frequency in a range from several kHz to a VHF band or even a frequency in a microwave band may be adopted.

On the other hand, anode electrode 3 is electrically grounded. On anode electrode 3, a substrate 7, which is an object, is placed such that substrate 7 is located between anode electrode 3 and cathode electrode 2 and opposed to cathode electrode 2. Substrate 7 is fixed to anode electrode 3 by a substrate fixing portion 11. Namely, anode electrode 3 corresponds to a holding portion for holding substrate 7 representing the object (a vertically holding portion).

It is noted that substrate 7 may be supported by anode electrode 3 with a substrate tray or the like (not shown) being interposed. Though substrate 7 may be placed on cathode electrode 2, in depositing a film on the object through plasma processing, in order to mitigate lowering in film quality due to damage caused by ions in plasma, substrate 7 is preferably placed on anode electrode 3. Anode electrode 3 contains a heater 21 for heating substrate 7. So long as heater 21 can heat substrate 7, it is not necessary to contain heater 21 in anode electrode 3 and it may be provided in the vicinity of anode electrode 3.

In addition, a cooling portion 22 is provided in the vicinity of heater 21. In general, such a component as circulating a liquid or a gas is used as cooling portion 22. In this plasma processing apparatus 50, cooling portion 22 for circulating cooling water in anode electrode 3 is provided. By disposing heater 21 and cooling portion 22 in the vicinity of substrate 7, a temperature of substrate 7 can more accurately be controlled.

An exhaust port 19a is provided in an upper portion (an upper wall portion) of a wall surface of chamber 1. An exhaust pipe 20a is connected to exhaust port 19a. Exhaust pipe 20a is connected to a vacuum pump 20b, which evacuates chamber 1. Plasma processing apparatus 50 should only include exhaust pipe 20a and vacuum pump 20b as an exhaust portion 20. In addition, a pressure regulation valve 17 is provided between exhaust port 19a and vacuum pump 20b. Pressure regulation valve 17 regulates a pressure in chamber 1, in which a gas has been introduced, to be substantially constant.

Regarding a position to place exhaust port 19a, exhaust port 19a should only be provided above a horizontal surface including an uppermost portion of substrate 7. Namely, the position to place exhaust port 19a is not limited to the wall surface of chamber 1 so long as exhaust port (opening end) 19a is arranged to be located above the highest portion of substrate 7, and for example, exhaust port 19a may be arranged to be located within chamber 1.

Meanwhile, a gas introduction port 10 is provided in a lower portion (a lower wall portion) of the wall surface of chamber 1. A position to place gas introduction port 10 is not limited thereto. In order to smoothly supply a gas in between cathode electrode 2 and anode electrode 3, gas introduction port 10 is preferably provided at a position opposite to exhaust port 19a, with the electrode pair of cathode electrode 2 and anode electrode 3 lying therebetween. In this plasma processing apparatus 50, gas introduction port 10 is provided below a horizontal surface including the lowermost portion of substrate 7. Namely, gas introduction port (opening end) 10 is arranged to be located below the lowest portion of substrate 7.

In addition, a gas supply portion 8 is provided outside chamber 1. Gas supply portion 8 is formed, for example, of a gas canister 8a, a flow rate controller 8b, a valve 8c, and the like. A gas 18 supplied from gas supply portion 8 flows through a gas supply pipe 9 and it is introduced into chamber 1 through gas introduction port 10. Any gas such as a dilute gas, a material gas and a doping gas, or a gas mixture thereof is used as gas 18. For example, in depositing a silicon-based thin film on substrate 7, a hydrogen gas ($H_2$) is used as a dilute gas, a silane gas ($SiH_4$) is used as a material gas, and a phosphine gas ($PH_3$) or a diborane gas ($B_2H_6$) is used as a doping gas. As the material gas or the like is exposed to plasma, the material gas or the like is decomposed and a silicon-based thin film is formed on substrate 7. The present plasma CVD apparatus 50 is structured as described above.

Temperature variation between the upper portion and the lower portion of the substrate and lessening thereof will now be described. A problem of increase in a surface temperature of a substrate located higher within the chamber or a portion of a substrate located higher within the chamber is particularly likely when the substrate has low thermal conductivity or when the substrate has large thermal capacity, for the following reasons. Heating and cooling of the substrate during plasma processing is generally carried out by a heater or a cooling portion disposed on the back of a processed surface of the substrate, such as heater 21 and cooling portion 22 provided in anode electrode 3. In such a structure, when the substrate has low thermal conductivity or when the substrate has large thermal capacity, heat does not readily conduct to the processed surface side of the substrate and the surface temperature of the processed surface of the substrate is readily affected by a temperature of an ambient gas atmosphere. Examples of substrates low in thermal conductivity include a glass substrate, a ceramics substrate, and a substrate made of resin such as polyimide.

In addition, in the plasma CVD apparatus, plasma is generated between the cathode electrode and the anode electrode, and electrons or ions in plasma collide with the cathode electrode, the anode electrode and the substrate. Accordingly, as the temperature of the cathode electrode, the anode electrode and the substrate is raised and becomes higher than a set temperature of heater 21, the temperature of the cathode electrode is greatly affected by the temperature of the ambient gas if the cathode electrode is not provided with the cooling portion, because heat radiation from the cathode electrode is achieved mainly through the ambient atmosphere.

When the temperature of the cathode electrode in a portion located in the upper portion of the chamber becomes higher than the temperature thereof in a portion located in the lower portion, difference in magnitude of strain (an amount of strain) between the upper portion and the lower portion of the cathode electrode is caused. Then, a distance between the cathode electrode and the anode electrode is different between the upper portion and the lower portion of the cathode electrode and it becomes difficult to achieve uniform plasma processing on the processed surface of the substrate. Such a problem is more noticeable when the distance between the cathode electrode and the anode electrode is several ten mm or less, in particular, as the distance between the electrodes becomes shorter to 30 mm or less and 20 mm or less. This is because, as the distance between the electrodes becomes shorter, change in the distance between the electrodes due to strain of the electrode exceeds error tolerance, and influence on the process is no longer ignorable.

In plasma CVD apparatus 50 described above, exhaust port 19a is disposed at a position higher than the uppermost portion of substrate 7. Thus, stagnation of the gas at a high temperature in the upper portion within chamber 1 is suppressed and temperature increase in cathode electrode 2 can be suppressed even when cathode electrode 2 is not provided with the cooling portion. Fluctuation of the distance between the electrodes due to strain of cathode electrode 2 or the like is thus eliminated and uniform plasma processing on substrate 7 can be achieved.

Here, cathode electrode 2 has been described by way of example, however, another member provided in the vicinity of heater 21, of which temperature is raised by heat generated by heater 21, may also affect plasma processing due to its temperature increase. As exhaust port 19a is disposed at the position higher than the uppermost portion of substrate 7 in the present plasma CVD apparatus 50, stagnation of the gas at a high temperature in the upper portion within chamber 1 is suppressed and temperature increase in such a member affecting plasma processing can be suppressed in the absence of the cooling portion.

In addition, plasma CVD apparatus 50 in which the substrate is arranged such that the processed surface thereof vertically extends (a direction perpendicular to the horizontal surface) has been described above by way of example, however, a temperature variation in the processed surface of the substrate may be caused due to gas temperature distribution in the vertical direction within the chamber also in an example where the substrate is placed in an obliquely inclined manner such that the processed surface of the substrate is inclined with respect to the horizontal surface. In the present plasma CVD apparatus 50, as exhaust port 19a is disposed at the position higher than the uppermost portion of substrate 7, stagnation of the gas at a high temperature in the upper portion within chamber 1 is suppressed and temperature variation within the processed surface of the substrate can be suppressed even though the substrate is arranged in an obliquely inclined manner.

In the plasma CVD apparatus, generally, a load lock chamber and an unload lock chamber are provided, in addition to the chamber for plasma processing of the substrate. The load lock chamber refers to a chamber for pre-heating the substrate after evacuating the chamber to produce vacuum, while the unload lock chamber refers to a chamber opened to the atmosphere for taking out the substrate.

In the plasma CVD apparatus of this type, the heater in the chamber for plasma processing is constantly in the ON state, and the substrate for which plasma processing has been completed is transferred to the unload lock chamber, while the substrate pre-heated in the load lock chamber is in turn transferred to the chamber. The substrates successively transferred to the chamber are thus subjected to plasma processing, and a ratio of time period during which a material gas or the like is introduced and plasma is generated in the chamber becomes higher within a certain prescribed period of time.

Here, as the gas heated by the energy of plasma stagnates in the upper portion within the chamber and the temperature of a member or the like around the cathode electrode and the heater is once raised, the cathode electrode and the like are less likely to be cooled because the ambient atmosphere is a vacuum atmosphere and the cathode electrode and the like may be maintained at a high temperature. On the other hand, in such a plasma CVD apparatus without including the load lock chamber and the unload lock chamber, in which the substrate is loaded in and unloaded from the chamber for plasma processing, the temperature of the electrode and the substrate are lowered before and after plasma processing, and the cathode electrode and the like are not maintained at a high temperature.

Even though plasma CVD apparatus 50 described above includes such load lock chamber and unload lock chamber, exhaust port 19a is disposed at the position higher than the uppermost portion of substrate 7, so that stagnation of the gas at a high temperature in the upper portion within chamber 1 is suppressed and the cathode electrode and the like are not maintained at the high temperature.

As described above, exhaust port 19a is disposed at the position higher than the uppermost portion of substrate 7 in the present plasma CVD apparatus 50, so that stagnation of the gas introduced in chamber 1, of which temperature has been raised by the energy of plasma, in a region in the upper portion of substrate 7, is suppressed. Thus, temperature increase of the surface of substrate 7 located in the upper portion of chamber 1 is suppressed and temperature distribution within the surface of substrate 7 can be improved. As temperature distribution within the surface of substrate 7 is thus made uniform, in the case of the plasma CVD apparatus, uniformity in the surface, of quality of a film formed on substrate 7 can be improved.

In the present embodiment, a plasma CVD apparatus has been described by way of example of a plasma processing apparatus. The plasma processing apparatus is not limited to the plasma CVD apparatus, and a plasma etching apparatus in which a film formed on a substrate is subjected to etching process by changing a gas to be introduced into the chamber and an apparatus for prescribed plasma processing of a substrate by exposing the substrate to plasma are widely applicable.

Modification

Figure 2:
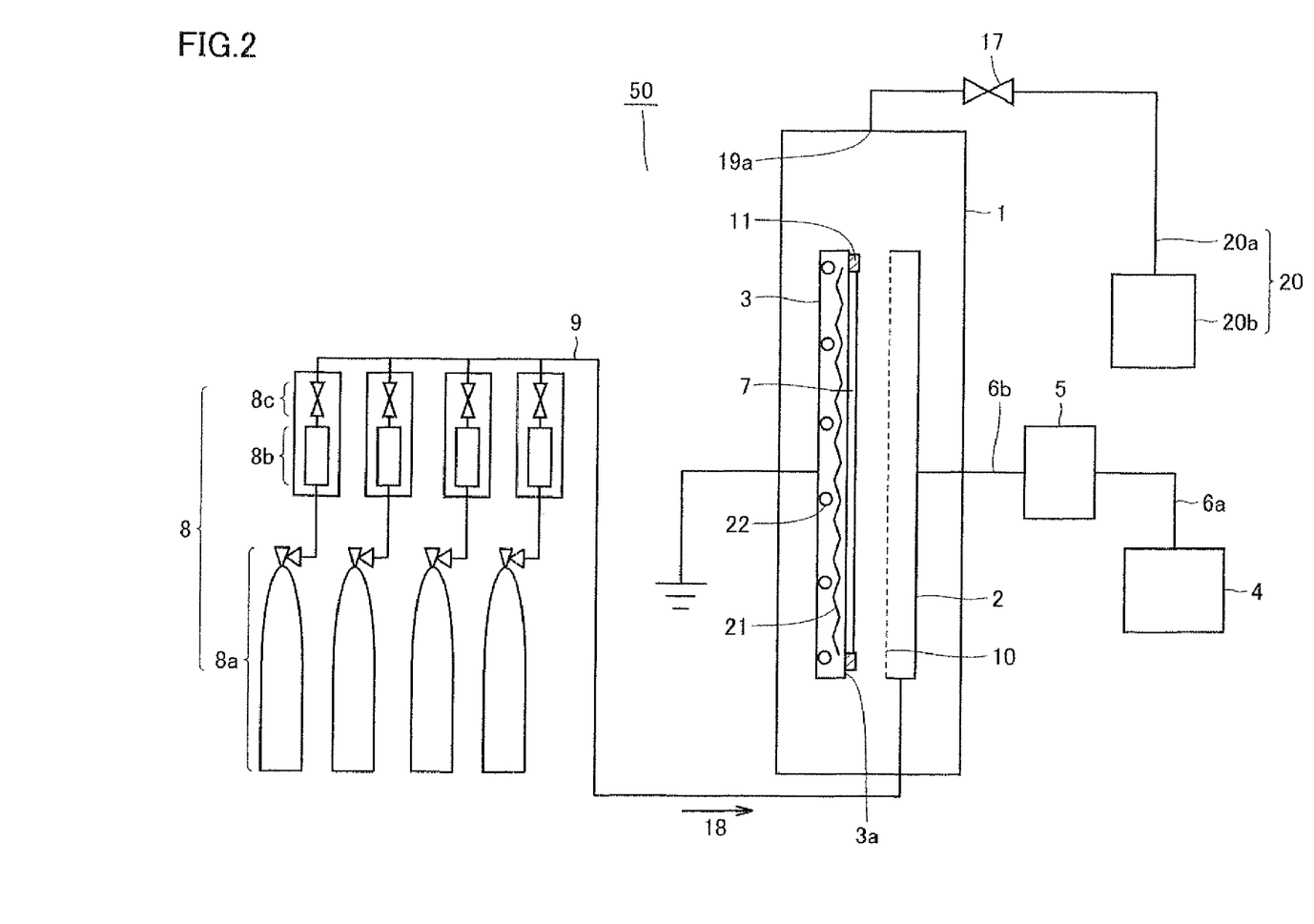
FIG. 2 is a diagram including a partial cross-section showing a structure of a plasma CVD apparatus according to a modification of that embodiment.

In plasma CVD apparatus 50 shown in FIG. 1, gas introduction port 10 is provided in the lower portion (lower wall portion) of the wall surface of chamber 1 by way of example. Alternatively, as shown in FIG. 2, a structure may be such that a plurality of gas introduction ports 10 are provided in discharge surface 2a of cathode electrode 2 opposed to substrate 7. Cathode electrode 2 is hollow, and a gas introduced therein is supplied to a region between cathode electrode 2 and anode electrode 3 through the plurality of gas introduction ports 10.

According to such a structure, the gas can more uniformly be supplied to a space between cathode electrode 2 and anode electrode 3 where plasma is generated, and uniformity in the surface, of plasma processing of substrate 7 can be improved. In addition, in an example where a film is formed on substrate 7 while substrate 7 is vertically arranged, adhesion of film flakes from cathode electrode 2 to the surface of substrate 7 can be lessened.

Second Embodiment

Figure 3:
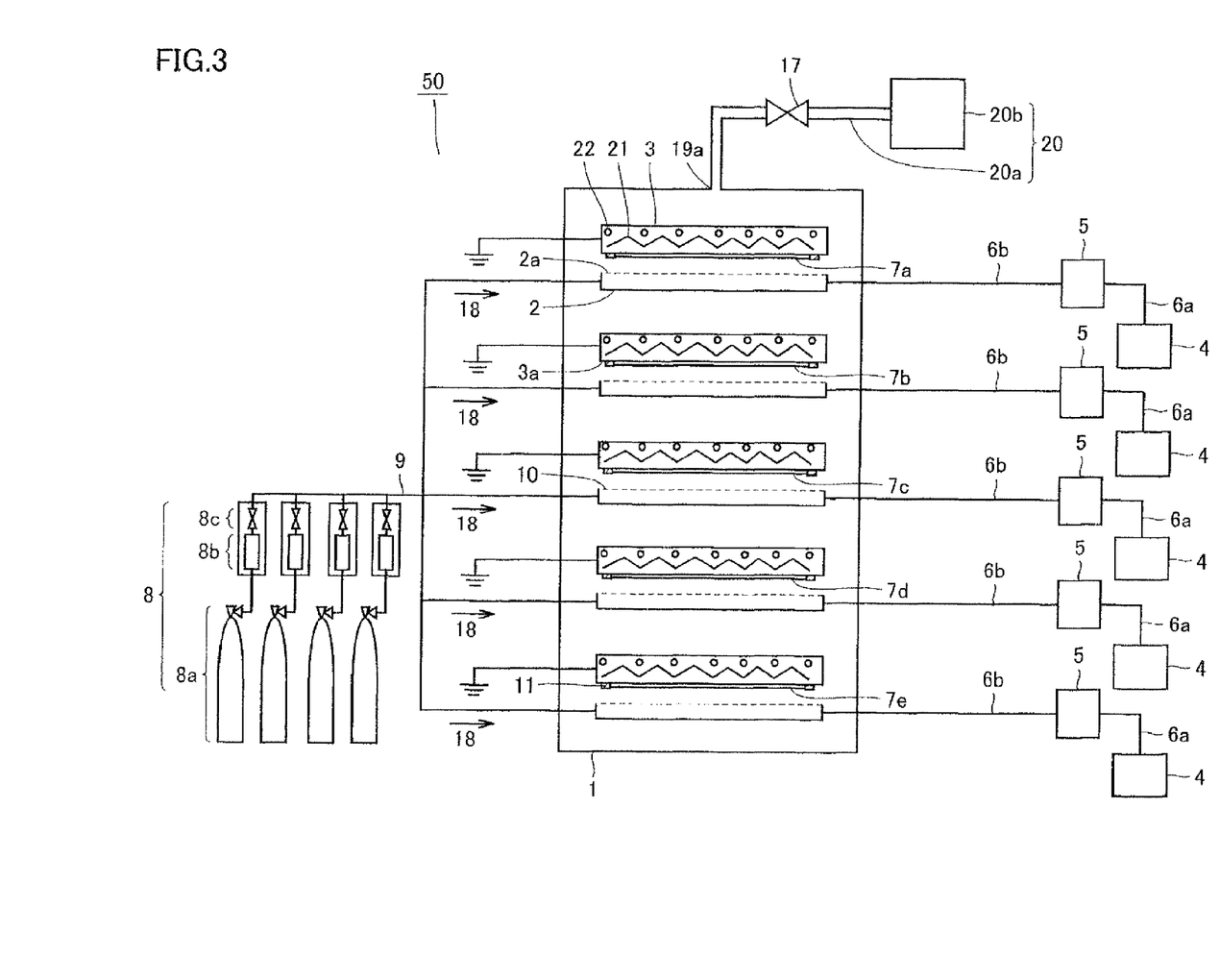
FIG. 3 is a diagram including a partial cross-section showing a structure of a plasma CVD apparatus according to a second embodiment of the present invention.

Here, an exemplary plasma CVD apparatus in which a plurality of substrates arranged in a substantially horizontal direction are arranged as stacked perpendicularly (in a vertical direction) within a chamber and they are simultaneously subjected to plasma processing will be described as the plasma processing apparatus. This plasma CVD apparatus is a plasma CVD apparatus including a parallel plate type electrode structure.

As shown in FIG. 3, a plurality of electrode pairs of opposing cathode electrode 2 and anode electrode 3 at a distance from each other are disposed within chamber 1 of plasma CVD apparatus 50. The plurality of electrode pairs are disposed vertically (in a vertical direction), and cathode electrode 2 and anode electrode 3 are disposed substantially horizontally in each electrode pair. Substrates 7a to 7e are fixed to discharge surfaces 3a of anode electrodes 3 by substrate fixing portions 11, respectively. Namely, each anode electrode 3 corresponds to a horizontally holding portion for horizontally holding substrate 7 representing the object, and a plurality of anode electrodes 3 correspond to a stack holding portion for holding a plurality of substrates 7a to 7e representing the object as stacked in the vertical direction.

It is noted that cathode electrode 2 and anode electrode 3 are not limited to the parallel plate type, so long as an electrode structure having opposing discharge surfaces 2a and 3a at a distance from each other is employed. As described previously, a distance between cathode electrode 2 and anode electrode 3 (distance between the electrodes) is determined in accordance with a desired plasma processing condition and it is generally set to several mm to several ten mm.

A plurality of gas introduction ports 10 are provided in discharge surface 2a of cathode electrode 2. Cathode electrode 2 is hollow, and a gas introduced therein is supplied to a region between cathode electrode 2 and anode electrode 3 through the plurality of gas introduction ports 10. According to such a structure, the gas can more uniformly be supplied to a region (space) between cathode electrode 2 and anode electrode 3 where plasma is generated, and uniformity in the surface, of plasma processing of substrate 7 can be improved.

In addition, exhaust port 19a is provided in the upper portion (upper wall portion) of the wall surface of chamber 1, and in particular, it is provided in a portion of the wall surface of the chamber located directly above the substantial center of discharge surface 3a, with respect to anode electrode 3 of the electrode pair located at the highest position. According to such a structure, the gas supplied to the region between cathode electrode 2 and anode electrode 3 where plasma is generated can substantially uniformly be exhausted from an area around cathode electrode 2 and temperature variation in the processed surface of substrate 7 can be suppressed.

Regarding a position to place exhaust port 19a, exhaust port 19a should only be provided above a horizontal surface including an uppermost portion of substrate 7. Namely, the position to place exhaust port 19a is not limited to the wall surface of chamber 1 so long as exhaust port (opening end) 19a is arranged to be located above substrate 7 arranged highest, and for example, exhaust port 19a may be arranged to be located within chamber 1. As the structure is otherwise the same as in the plasma CVD apparatus shown in FIG. 1, the same member has the same reference numeral allotted and description thereof will not be provided.

In an example where a plurality of substrates are arranged as stacked in a vertical direction within a chamber and they are simultaneously subjected to plasma processing, temperature variation among the substrates is noticeable as the number of substrates increases.

According to plasma CVD apparatus 50 described above, exhaust port 19a is disposed at a position higher than the highest portion of substrate 7, so that stagnation of the gas introduced in chamber 1, of which temperature has been raised by the energy of plasma, in the region in the upper portion within chamber 1 is suppressed. Thus, temperature increase of the surface of substrate 7 located in the upper portion of chamber 1 is suppressed and temperature difference from the surface temperature of the substrate located in the lower portion of the chamber can be suppressed to be small.

Consequently, temperature variation among a plurality of substrates 7 arranged as stacked in a vertical direction within chamber 1 is suppressed and uniformity of plasma processing on substrates 7 can be improved. As temperature distribution within the processed surface of substrate 7 and temperature distribution among substrates 7 thus become uniform, uniformity in the surface, of quality of the film formed on substrate 7 can be improved in a case of a plasma CVD apparatus.

In addition, in plasma CVD apparatus 50 described above, the electrode pair of cathode electrode 2 and anode electrode 3 is disposed such that anode electrode 3 is located higher and the substrate is held on that anode electrode 3. Thus, the film is formed on the surface of substrate 7 with the surface thereof facing down (deposition-up) and thus adhesion of film flakes from the cathode electrode to the surface of substrate 7 can be prevented. On the other hand, in an example where the electrode pair is disposed such that anode electrode 3 is located lower (deposition-down), the substrate can more reliably be grounded.

In the present embodiment, a plasma CVD apparatus has been described by way of example of a plasma processing apparatus. The plasma processing apparatus is not limited to the plasma CVD apparatus, and a plasma etching apparatus in which a film formed on a substrate is subjected to etching process by changing a gas to be introduced into the chamber and an apparatus for prescribed plasma processing of a substrate by exposing the substrate to plasma are widely applicable.

Third Embodiment

Figure 4:
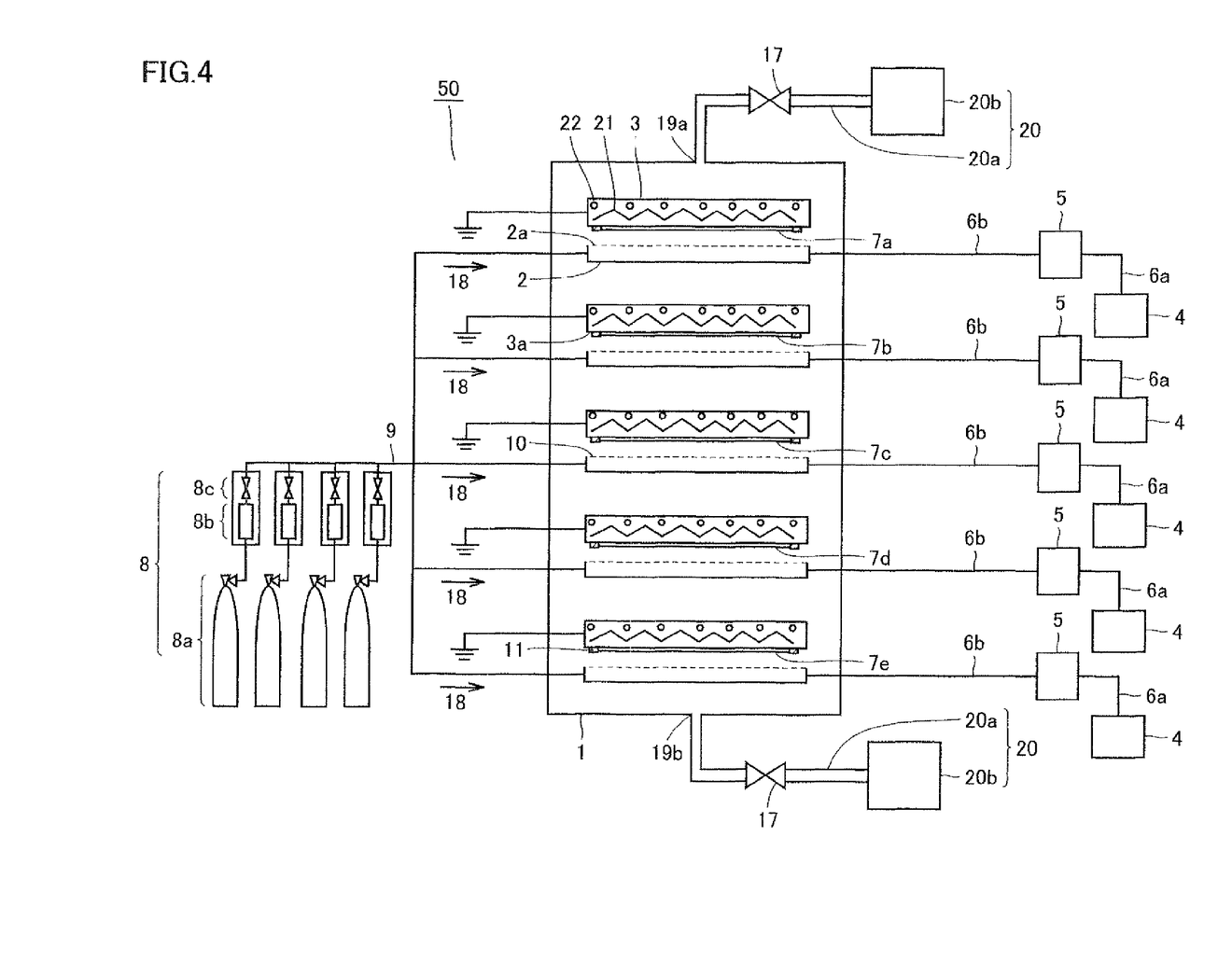
FIG. 4 is a diagram including a partial cross-section showing a structure of a plasma CVD apparatus according to a third embodiment of the present invention.

Here, another exemplary plasma CVD apparatus in which a plurality of substrates arranged in a substantially horizontal direction are arranged as stacked vertically (perpendicularly or in a vertical direction) within a chamber and they are simultaneously subjected to plasma processing will be described as the plasma processing apparatus.

As shown in FIG. 4, in this plasma CVD apparatus 50, first exhaust port 19a is provided in the upper portion (upper wall portion) of the wall surface of chamber 1 and a second exhaust port 19b is further provided in the lower portion (lower wall portion) of the wall surface of chamber 1. Regarding a position to place first exhaust port 19a, the position to place exhaust port 19a is not limited to the wall surface of chamber 1 so long as first exhaust port (opening end) 19a is arranged to be located above substrate 7 arranged highest, and for example, exhaust port 19a may be arranged to be located within chamber 1.

In addition, regarding a position to place second exhaust port 19b, the position to place second exhaust port 19b is not limited to the wall surface of chamber 1 so long as second exhaust port (opening end) 19b is arranged to be located below substrate 7 arranged lowest, and for example, exhaust port 19*b* may be arranged to be located within chamber 1. As the structure is otherwise the same as in the plasma CVD apparatus shown in FIG. 3, the same member has the same reference numeral allotted and description thereof will not be provided.

According to the plasma CVD apparatus described above, in addition to first exhaust port 19*a*, second exhaust port 19*b* is provided in the lower portion of the wall surface of chamber 1 and the gas present in the lower portion within chamber 1 is exhausted, so that an amount of the gas stagnating within chamber 1 with its temperature being raised by the energy of plasma can be decreased. Thus, temperature increase of the gas around substrate 7 located in the upper portion within chamber 1 is further suppressed and uniformity of plasma processing on substrates 7 can further be improved. As temperature distribution within the processed surface of substrate 7 and temperature distribution among substrates 7 thus become further uniform, uniformity in the surface, of quality of the film formed on substrate 7 can significantly be improved.

In the present embodiment, a plasma CVD apparatus has been described by way of example of a plasma processing apparatus. The plasma processing apparatus is not limited to the plasma CVD apparatus, and a plasma etching apparatus in which a film formed on a substrate is subjected to etching process by changing a gas to be introduced into the chamber and an apparatus for prescribed plasma processing of a substrate by exposing the substrate to plasma are widely applicable.

Example 1

Deposition of an i-type crystalline silicon film by using the plasma CVD apparatus shown in FIG. 2 and evaluation thereof will be described here as Example 1. Initially, a glass substrate having a size of 1 m×1 m was employed as substrate 7. Then, the glass substrate was fixed to anode electrode 3 by using substrate fixing portion 11. A distance between cathode electrode 2 and anode electrode 3 (distance between electrodes) was set to 20 mm. A hydrogen gas (dilute gas) at a flow rate of 2000 sccm and a silane gas (material gas) at a flow rate of 20 sccm were introduced in chamber 1 as gas 18. A pressure in chamber 1 during film deposition was set to 600 Pa.

After the pressure in chamber 1 became stable, high-frequency power at a frequency of 13.56 MHz was supplied to cathode electrode 2 and power density provided to discharge surface 2*a* of cathode electrode 2 was set to 0.2 W/cm². The i-type crystalline silicon film was formed on the surface of the glass substrate as a result of generation of plasma in a region between cathode electrode 2 and anode electrode 3 and decomposition of the introduced gas.

Figure 5:
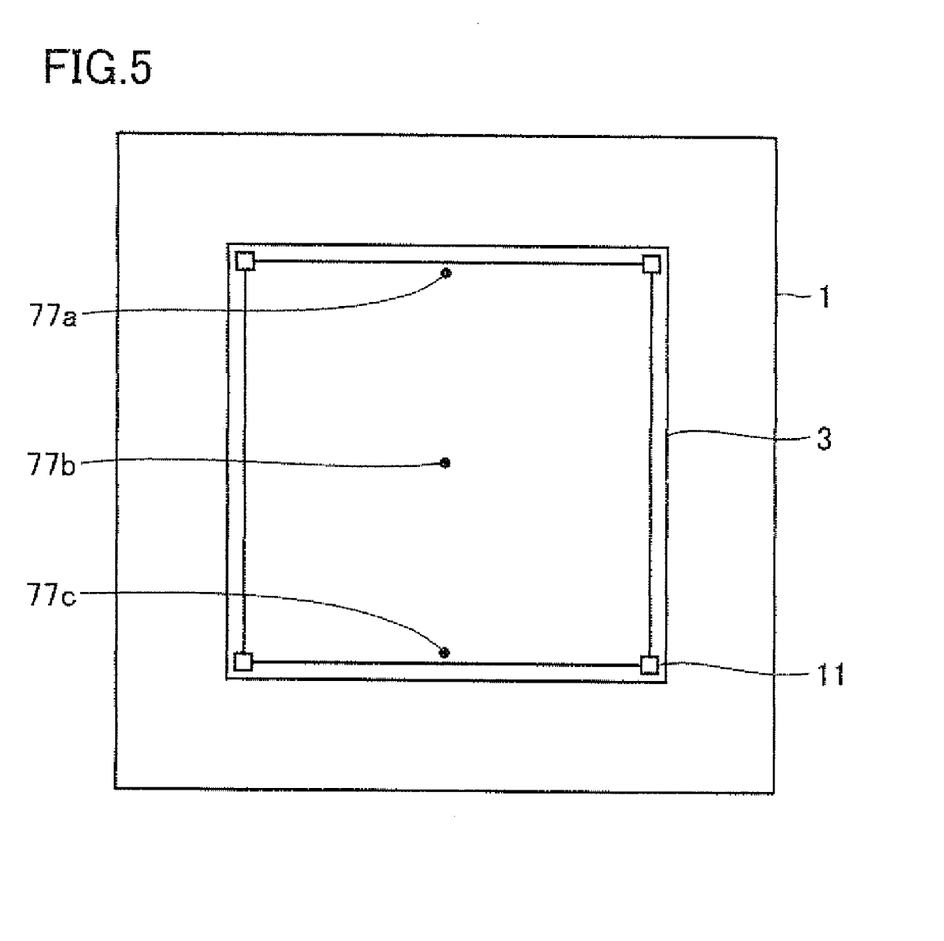
FIG. 5 is a plan view showing a location of temperature measurement in a processed surface of a substrate in Example 1 of the present invention.

The temperature of substrate 7 was controlled by heater 21 and cooling portion 22 such that the temperature at a lowermost portion 77*c* of the processed surface of substrate 7 was set to 200° C. (see FIG. 5). As shown in FIG. 5, temperatures at three locations in total, that is, respective temperatures at lowermost portion 77*c* of the processed surface, a central portion 77*b* of the processed surface, and an uppermost portion 77*a* of the processed surface, were measured. The temperature at each point was measured by bringing a thermocouple in contact with each location. In addition, regarding the timing of measurement of the temperature, initially, the temperature was measured at the time point prior to introduction of the gas in chamber 1, and the temperature was measured at the time point after lapse of 60 minutes since introduction of the gas and generation of plasma.

Figure 6:
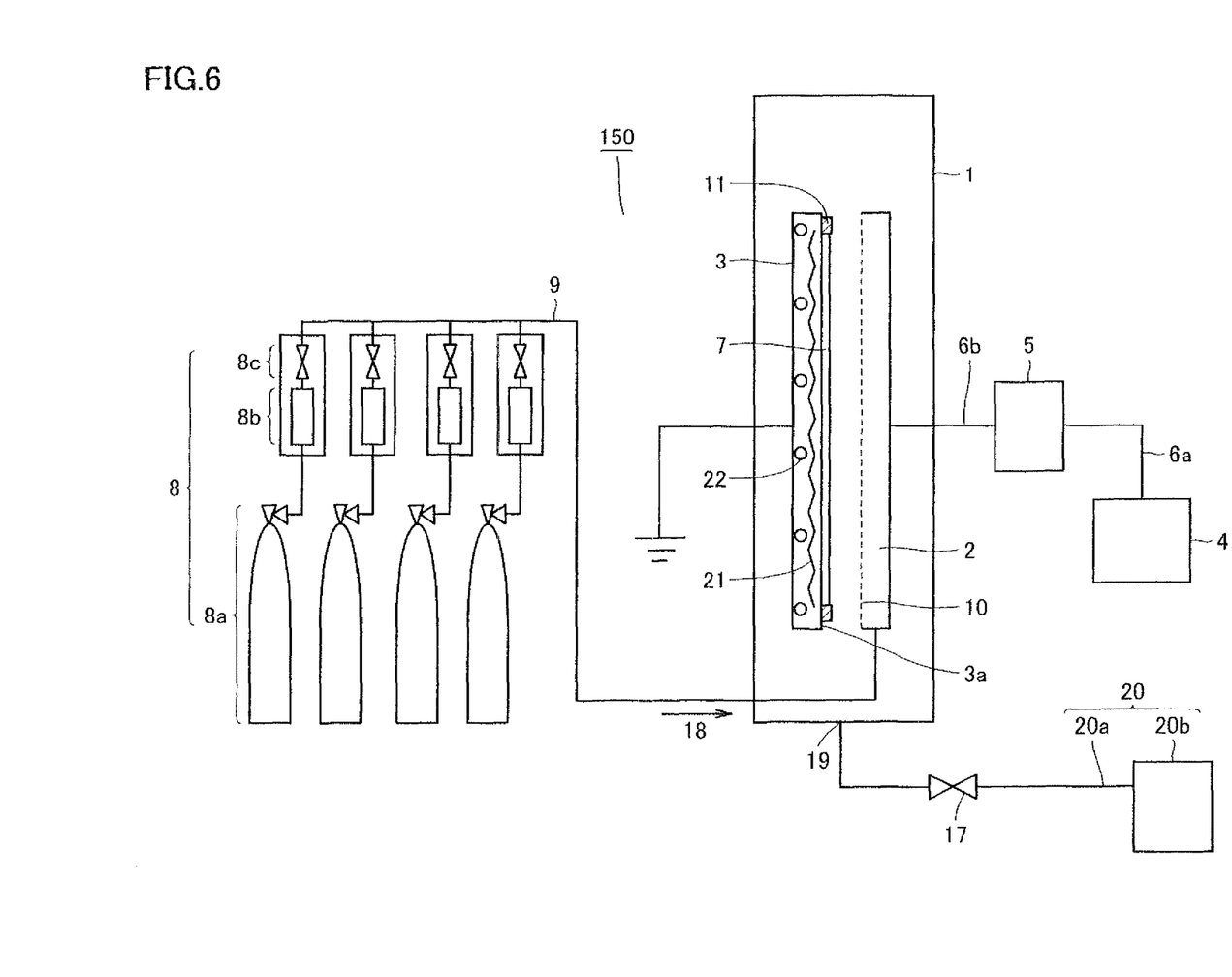
FIG. 6 is a diagram including a partial cross-section showing a structure of a plasma CVD apparatus according to Comparative Example 1 with respect to that Example.

Meanwhile, according to Comparative Example 1, a plasma CVD apparatus 150 shown in FIG. 6 was employed to deposit an i-type crystalline silicon film on the substrate under the similar conditions and the temperature of the processed surface of substrate 7 was measured. It is noted that Comparative Example 1 is different from the present plasma CVD apparatus 50 in that an exhaust port 19 is provided in the lower portion of chamber 1.

Results of measurement of temperature of the processed surface of substrate 7 in the present plasma CVD apparatus 50 are shown in Table 1, together with results in Comparative Example 1. As shown in Table 1, initially, it was found in Comparative Example 1 that the temperature of the processed surface of substrate 7 was higher as the location was higher and that lowermost portion 77*c* was different in temperature by approximately 10° C. from uppermost portion 77*a*. Temperature variation in the substrate by approximately 10° C. causes significant change in quality of the film formed on the substrate, which affects device characteristics.

TABLE 1

|  | Measurement Position | Before Gas Introduction | After Lapse of 60 Minutes Since Plasma Generation |
|---|---|---|---|
| Example 1 | Upper Portion of Processed Surface of Substrate (77a) | 201° C. | 201° C. |
|  | Intermediate Portion of Processed Surface of Substrate (77b) | 200° C. | 204° C. |
|  | Lower Portion of Processed Surface of Substrate (77c) | 200° C. | 206° C. |
| Comparative Example 1 | Upper Portion of Processed Surface of Substrate (77a) | 201° C. | 212° C. |
|  | Intermediate Portion of Processed Surface of Substrate (77b) | 200° C. | 207° C. |
|  | Lower Portion of Processed Surface of Substrate (77c) | 200° C. | 202° C. |

On the other hand, it was confirmed according to the present plasma CVD apparatus 50 that the gas in the vicinity of uppermost portion 77*a* of the processed surface of the substrate was efficiently exhausted from exhaust port 19*a* and the gas at a high temperature did not stagnate in the upper portion of chamber 1, and therefore the temperature at uppermost portion 77*a* of the processed surface of the substrate was lower than the temperature of lowermost portion 77*c* by approximately 5° C. and temperature variation within the processed surface of substrate 7 was lessened. Thus, it was found that, as a result of suppression of temperature variation within the processed surface of substrate 7, uniformity in the surface, of film quality such as crystallization ratio or conductivity of the i-type crystalline silicon film formed on the processed surface of substrate 7 could be improved.

Example 2

Deposition of an i-type crystalline silicon film by using plasma CVD apparatus 50 shown in FIG. 3 and evaluation thereof will be described here as Example 2. Initially, a glass substrate having a size of 1 m×1 m was employed as substrates 7a to 7e. Then, each glass substrate was fixed to anode electrode 3 by using substrate fixing portion 11. A distance between cathode electrode 2 and anode electrode 3 (distance between electrodes) was set to 20 mm. Film deposition conditions were the same as in Example 1.

Temperatures at three locations, that is, respective temperatures at a central portion of the processed surface of the substrate located in the lower portion within the chamber, a central portion of the processed surface of the substrate located in the upper portion, and a central portion of the processed surface of the substrate located intermediate between the upper portion and the lower portion, were measured. It is noted that each of these temperatures is assumed as the average temperature in the substrate surface.

Figure 7:
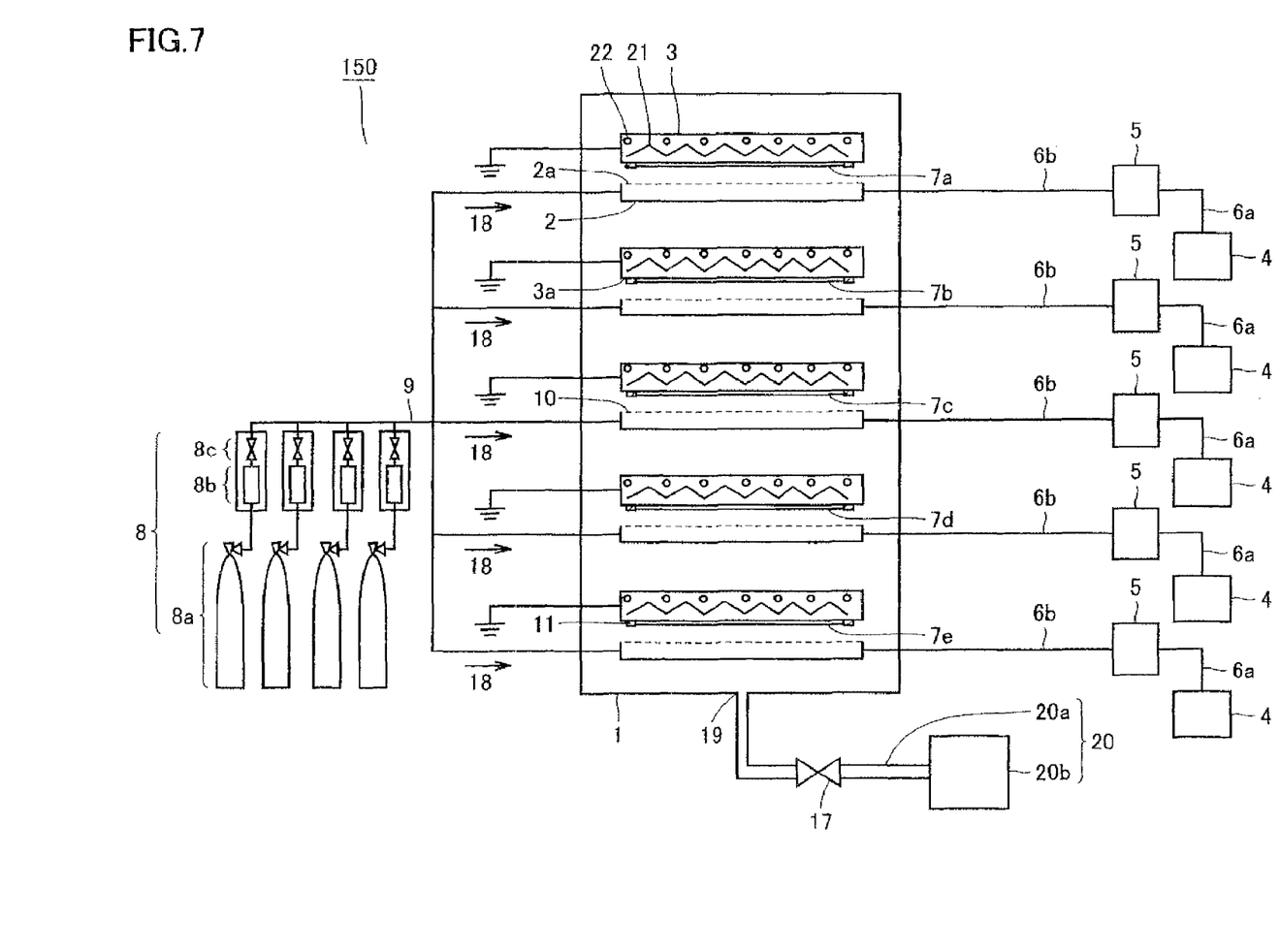
FIG. 7 is a diagram including a partial cross-section showing a structure of a plasma CVD apparatus according to Comparative Example 2 with respect to Example 2 of the present invention.

Meanwhile, according to Comparative Example 2, plasma CVD apparatus 150 shown in FIG. 7 was employed to deposit an i-type crystalline silicon film on the substrate under the similar conditions and the temperature of the processed surface of substrate 7 was measured. It is noted that Comparative Example 2 is different from the present plasma CVD apparatus in that exhaust port 19 is provided in the lower portion of chamber 1.

Results of measurement of temperature of the processed surface of substrate 7 in the present plasma CVD apparatus 50 are shown in Table 2, together with results in Comparative Example 1 As shown in Table 2, initially, it was found in Comparative Example 2 that the temperature of the processed surface of substrate 7a located in the upper portion of chamber 1 was higher than the temperature of the processed surface of substrate 7e located in the lower portion by approximately 10° C.

On the other hand, it was found according to the present plasma CVD apparatus 50 that the processed surface of substrate 7a located in the upper portion of chamber 1 was different in temperature by approximately 6° C. from the processed surface of substrate 7e located in the lower portion and temperature variation among the substrates from the substrate in the lower portion to the substrate in the upper portion was lessened. It was found that, as a result of suppression of temperature variation among the substrates, uniformity of film quality such as crystallization ratio or conductivity of the i-type crystalline silicon films formed on the respective processed surfaces of substrates 7a to 7e could be improved.

Example 3

Deposition of an i-type crystalline silicon film by using plasma CVD apparatus 50 shown in FIG. 4 and evaluation thereof will be described here as Example 3, Initially, a glass substrate having a size of 1 m×1 m was employed as substrates 7a to 7e. Then, each glass substrate was fixed to anode electrode 3 by using substrate fixing portion 11. A distance between cathode electrode 2 and anode electrode 3 (distance between electrodes) was set to 20 mm. Film deposition conditions were the same as in Example 2.

Temperatures at three locations, that is, respective temperatures at a central portion of the processed surface of substrate 7e located in the lower portion within the chamber, a central portion of the processed surface of substrate 7a located in the upper portion, and a central portion of the processed surface of substrate 7c located intermediate between the upper portion and the lower portion, were measured. The present plasma CVD apparatus 50 was formed by providing a second exhaust port in the plasma CVD apparatus in Example 2.

Results of measurement of temperature of the processed surface of substrate 7 in the present plasma CVD apparatus 50 are shown in Table 3, together with results in Example 2 and Comparative Example 2. As shown in Table 3, it was found that, according to the present plasma CVD apparatus 50, the temperature of the processed surface of substrate 7c located in an intermediate portion in chamber 1 was higher only by approximately 3° C. than the temperature of the processed surface of substrate 7e located in the lower portion and that temperature variation among substrates 7a to 7e was further lessened as compared with Example 2.

This is because the gas in the vicinity of substrate 7a located in the upper portion of chamber 1 is exhausted from exhaust port 19a in the upper portion and does not stagnate and because the gas heated by plasma energy is exhausted from exhaust port 19b in the lower portion of chamber 1 and the amount of the gas moving upward to the upper portion of chamber 1 can be reduced. It was found that, as a result of further suppression of temperature variation among the substrates, uniformity of film quality such as crystallization ratio or conductivity of the i-type crystalline silicon film formed on the respective processed surfaces of substrates 7a to 7e could further be improved.

TABLE 2

| | Measurement Position | Before Gas Introduction | After Lapse of 60 Minutes Since Plasma Generation |
|---|---|---|---|
| Example 2 | Substrate in Upper Portion (7a) | 201° C. | 201° C. |
| | Substrate in Intermediate Portion (7c) | 200° C. | 203° C. |
| | Substrate in Lower Portion (7e) | 200° C. | 207° C. |
| Comparative Example 2 | Substrate in Upper Portion (7a) | 201° C. | 212° C. |
| | Substrate in Intermediate Portion (7c) | 201° C. | 208° C. |
| | Substrate in Lower Portion (7e) | 200° C. | 202° C. |

TABLE 3

|  | Measurement Position | Before Gas Introduction | After Lapse of 60 Minutes Since Plasma Generation |
|---|---|---|---|
| Example 3 | Substrate in Upper Portion (7a) | 201° C. | 202° C. |
|  | Substrate in Intermediate Portion (7c) | 201° C. | 204° C. |
|  | Substrate in Lower Portion (7e) | 200° C. | 201° C. |
| Example 2 | Substrate in Upper Portion (7a) | 201° C. | 201° C. |
|  | Substrate in Intermediate Portion (7c) | 200° C. | 203° C. |
|  | Substrate in Lower Portion (7e) | 200° C. | 207° C. |
| Comparative Example 2 | Substrate in Upper Portion (7a) | 201° C. | 212° C. |
|  | Substrate in Intermediate Portion (7c) | 201° C. | 208° C. |
|  | Substrate in Lower Portion (7e) | 200° C. | 202° C. |

It should be understood that the embodiments and the examples disclosed herein are illustrative and non-restrictive. The scope of the present invention is defined by the terms of the claims, rather than the description above, and is intended to include any modifications within the scope and meaning equivalent to the terms of the claims.

INDUSTRIAL APPLICABILITY

The present invention is effectively utilized as a technique for forming a semiconductor device by subjecting a substrate to plasma processing.

The invention claimed is:

1. A plasma processing apparatus in which an object to be subjected to plasma processing is loaded for subjecting the loaded object to plasma processing, comprising:
   a chamber in which plasma processing is performed;
   a parallel plate type cathode electrode and anode electrode disposed horizontally in said chamber such that respective discharge surfaces thereof are opposed to one another;
   a holding assembly holding the object on said cathode electrode or said anode electrode;
   an introduction port for supplying a gas for processing into a plasma generation space between said cathode electrode and said anode electrode where plasma is generated; and
   a first exhaust port for exhausting gas from within said chamber, said first exhaust port being disposed in an upper wall portion of said chamber above a center of said anode electrode such that said gas supplied through said introduction port and flowing toward a side in said chamber from between said cathode electrode and said anode electrode can be exhausted in an upward direction.

2. The plasma processing apparatus according to claim 1, wherein said holding assembly includes a stack holding assembly for holding a plurality of horizontally held substrates as objects stacked in a vertical direction.

3. The plasma processing apparatus according to claim 1, further comprising:
   a second exhaust port for exhausting gas within said chamber, wherein said second exhaust port is disposed in a lower wall portion of said chamber under a center of said anode electrode.

4. A plasma processing apparatus in which an object to be subjected to plasma processing is loaded for subjecting the loaded object to plasma processing, comprising:
   a chamber in which plasma processing is performed;
   a parallel plate type cathode electrode and anode electrode disposed horizontally in said chamber such that respective discharge portions thereof are opposed to one another;
   a holding assembly for holding the object on said cathode electrode or said anode electrode;
   an introduction port for supplying a gas for processing into a plasma generation space between said cathode electrode and said anode electrode where plasma is generated; and
   an exhaust port for exhausting the gas within said chamber, a plurality of said cathode electrodes and a plurality of said anode electrodes being disposed in said chamber in a vertical direction, said exhaust port being disposed in an upper wall portion of said chamber above a center of said anode electrode such that said gas supplied through said introduction port and flowing toward a side in said chamber from between said cathode electrode and said anode electrode can be exhausted in an upward direction.

5. A plasma processing method for subjecting an object loaded in a chamber to plasma processing, comprising:
   holding an object between a parallel plate type cathode electrode and anode electrode which are horizontally disposed in said chamber such that respective discharge surfaces thereof are opposed to one another;
   supplying a gas between said cathode electrode and said anode electrode;
   generating plasma in a plasma generation space between said cathode electrode and said anode electrode;
   subjecting said object to plasma processing by exposing said object to said plasma; and
   exhausting said gas supplied into said chamber and flowing toward a side in said chamber from between said cathode electrode and said anode electrode in an upward direction from a position in an upper wall portion of said chamber above a center of said anode electrode.

6. A plasma processing apparatus in which an object to be subjected to plasma processing is loaded for subjecting the loaded object to plasma processing to manufacture a semiconductor device, comprising:
   a chamber in which plasma processing to manufacture a semiconductor device is performed;
   a parallel plate type cathode electrode and anode electrode disposed horizontally in said chamber such that respective discharge surfaces thereof are opposed to one another;
   a holding assembly holding the object on said cathode electrode or said anode electrode;
   an introduction port for supplying a gas for processing into a plasma generation space between said cathode electrode and said anode electrode where plasma is generated; and a first exhaust port for exhausting gas from within said chamber, said first exhaust port being disposed in an upper wall portion of said chamber above a center of said anode electrode such that said gas supplied through said introduction port and flowing toward a side in said chamber from between said cathode electrode and said anode electrode can be exhausted in an upward direction.

7. A plasma processing method for making a semiconductor device by subjecting an object loaded in a chamber to plasma processing to form a semiconductor device, comprising:

holding an object between a parallel plate type cathode electrode and anode electrode which are horizontally disposed in said chamber such that respective discharge surfaces thereof are opposed to one another;

supplying a gas between said cathode electrode and said anode electrode;

generating plasma in a plasma generation space between said cathode electrode and said anode electrode;

subjecting said object to plasma processing by exposing said object to said plasma; and exhausting said gas supplied into said chamber and flowing toward a side in said chamber from between said cathode electrode and said anode electrode in an upward direction from a position in an upper wall portion of said chamber above a center of said anode electrode.

* * * * *